US012677610B2

(12) United States Patent
Ko et al.

(10) Patent No.: US 12,677,610 B2
(45) Date of Patent: Jul. 7, 2026

(54) METHOD FOR PROCESSING A SUBSTRATE

(71) Applicant: ASM IP Holding B.V., Almere (NL)

(72) Inventors: DongHyun Ko, Hwaseong-si (KR); HakJoon Lee, Seoul (KR); SungKyu Kang, Hwaseong-si (KR)

(73) Assignee: ASM IP Holding B.V., Almere (NL)

( * ) Notice: Subject to any disclaimer, the term of this patent is extended or adjusted under 35 U.S.C. 154(b) by 721 days.

(21) Appl. No.: 17/941,211

(22) Filed: Sep. 9, 2022

(65) Prior Publication Data

US 2023/0092185 A1      Mar. 23, 2023

Related U.S. Application Data

(60) Provisional application No. 63/243,970, filed on Sep. 14, 2021.

(51) Int. Cl.
| | |
|---|---|
| *H10P 14/60* | (2026.01) |
| *C23C 16/34* | (2006.01) |
| *C23C 16/40* | (2006.01) |
| *C23C 16/455* | (2006.01) |
| *C23C 16/505* | (2006.01) |
| *H01J 37/32* | (2006.01) |
| *H10P 14/692* | (2026.01) |
| *H10P 14/694* | (2026.01) |

(52) U.S. Cl.
CPC ........ *H10P 14/6336* (2026.01); *C23C 16/345* (2013.01); *C23C 16/402* (2013.01); *C23C 16/45536* (2013.01); *C23C 16/505* (2013.01); *H01J 37/32082* (2013.01); *H01J 37/32449* (2013.01); *H10P 14/69215* (2026.01); *H10P 14/69433* (2026.01); *H01J 2237/332* (2013.01)

(58) Field of Classification Search
CPC ......... H01L 21/02274; H01L 21/02164; H01L 21/0217; C23C 16/345; C23C 16/402; C23C 16/45536; C23C 16/505; H01J 37/32082; H01J 37/32449; H01J 2237/332
See application file for complete search history.

(56) References Cited

U.S. PATENT DOCUMENTS

| | | | | | |
|---|---|---|---|---|---|
| 2014/0141542 | A1* | 5/2014 | Kang | .................... | C23C 16/345 438/761 |
| 2015/0323711 | A1* | 11/2015 | Bessho | ............. | G02F 1/133606 349/71 |

OTHER PUBLICATIONS

Ip.com word search (Year: 2026).*

* cited by examiner

*Primary Examiner* — Zandra V Smith
*Assistant Examiner* — Andre C Stevenson
(74) *Attorney, Agent, or Firm* — Snell & Wilmer L.L.P.

(57) ABSTRACT

In one embodiment, a particle with a first particle thickness may be formed on a film with a first thickness, followed by a plasma treatment. The first particle thickness may be reduced to a second particle thickness below an allowable limit and the first film thickness may be reduced to a second film thickness by the plasma treatment. In another embodiment, a particle with a first particle thickness may be formed on a first film with a first film thickness, followed by a plasma treatment. The first particle thickness may be reduced to a second particle thickness below an allowable limit and the first film thickness may be reduced to a second film thickness by the plasma treatment. After the plasma treatment, a second film with a third film thickness may be deposited on the first film and the particle may be buried in the second film.

18 Claims, 5 Drawing Sheets

(a)          (b)          (c)

PRIOR ART

FIG. 5

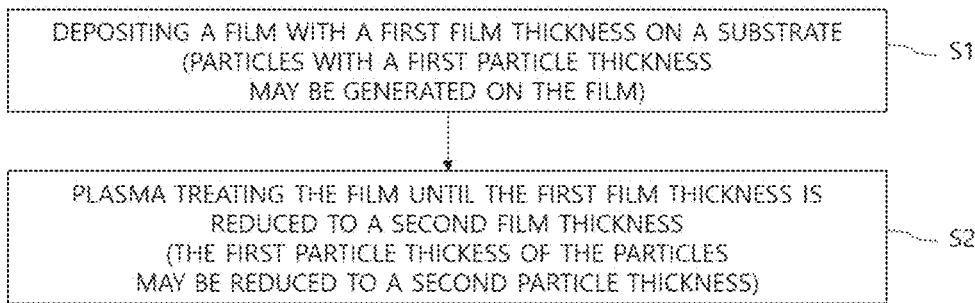

DEPOSITING A FILM WITH A FIRST FILM THICKNESS ON A SUBSTRATE
(PARTICLES WITH A FIRST PARTICLE THICKNESS
MAY BE GENERATED ON THE FILM) — S1

PLASMA TREATING THE FILM UNTIL THE FIRST FILM THICKNESS IS
REDUCED TO A SECOND FILM THICKNESS
(THE FIRST PARTICLE THICKESS OF THE PARTICLES
MAY BE REDUCED TO A SECOND PARTICLE THICKNESS) — S2

FIG. 6

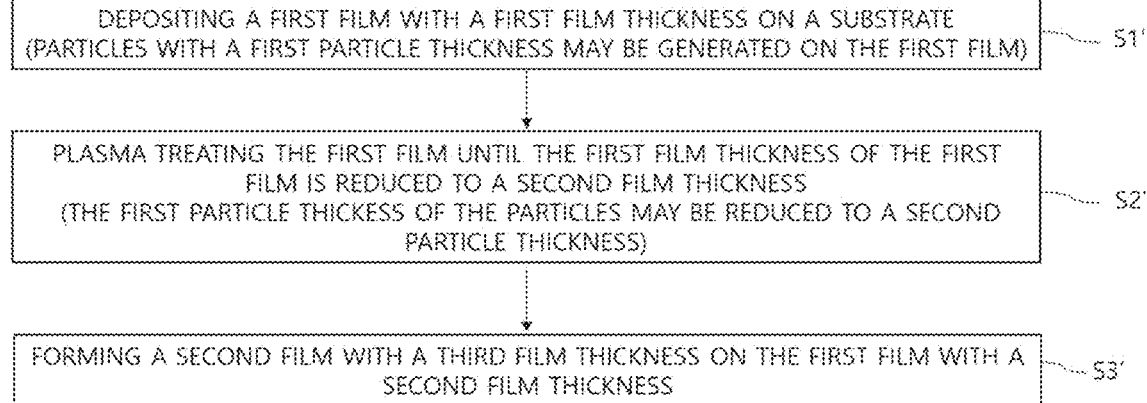

DEPOSITING A FIRST FILM WITH A FIRST FILM THICKNESS ON A SUBSTRATE
(PARTICLES WITH A FIRST PARTICLE THICKNESS MAY BE GENERATED ON THE FIRST FILM) — S1'

PLASMA TREATING THE FIRST FILM UNTIL THE FIRST FILM THICKNESS OF THE FIRST
FILM IS REDUCED TO A SECOND FILM THICKNESS
(THE FIRST PARTICLE THICKESS OF THE PARTICLES MAY BE REDUCED TO A SECOND
PARTICLE THICKNESS) — S2'

FORMING A SECOND FILM WITH A THIRD FILM THICKNESS ON THE FIRST FILM WITH A
SECOND FILM THICKNESS — S3'

METHOD FOR PROCESSING A SUBSTRATE

CROSS-REFERENCE TO RELATED APPLICATIONS

This application claims priority to U.S. Provisional Patent Application Ser. No. 63/243,970 filed Sep. 14, 2021, titled METHOD FOR PROCESSING A SUBSTRATE, the disclosure of which is hereby incorporated by reference in its entirety.

BACKGROUND

Technical Field

The disclosure relates to a method for processing a substrate, and more particularly to controlling a size of particles in order to prevent a quality of film and operating efficiency of a substrate processing apparatus from being deteriorated.

Description of the Related Arts

In a semiconductor film deposition process, a film may be deposited on a substrate by supplying a source gas and a reactant to a reactor. But as the number of processed substrate increases, the film may be also deposited on the inner surface of the reactor, which then may diffuse in a reaction space and drop onto the substrate in the form of particles.

Particles can contaminate the reactor, destroy device structures on the substrate, and cause malfunction and defects of the device. Particularly, the size of the particles may be increased with a greater the number of processed substrates; this can lead to defects on the substrate and the lowered yield of devices.

Therefore, it may be ideal for a process not to generate particles. But the film deposition process is based on a gas reaction between gases, so it may not be possible for the process not to generate particles.

A conventional dry cleaning process as shown in FIG. 1 cleans the reactor by supplying a cleaning gas to the reactor when an accumulated number of processed substrates reaches a dry cleaning cycle. The dry cleaning process is the most widely used method, but it includes a seasoning process to create an environment optimized for the normal process after the dry cleaning and requires a lot of time that lowers an operating efficiency of the substrate processing apparatus.

A wet cleaning is another method of cleaning a reactor as shown in FIG. 2. In wet cleaning process, the reactor is disassembled when the accumulated number of processed substrates reaches a wet cleaning cycle and reactor parts constituting a reactor are cleaned in a cleaning solution.

But the wet cleaning process includes lowering a reactor temperature, disassembling a reactor, a wet cleaning, reassembling the reactor, raising a reactor temperature, and seasoning the reactor to create an environment for a normal process. This may require a lot of time and may lower an operating efficiency of the substrate processing apparatus.

SUMMARY

The present disclosure provides a method for controlling a thickness of the particles on a substrate.

In one embodiment, a particle with a first particle thickness may be formed on a film with a first film thickness, followed by a plasma treatment. The first particle thickness of the particle may be reduced to a second particle thickness below an allowable limit and the first film thickness of the film may be reduced to a second film thickness by the plasma treatment.

In another embodiment, a particle with a first particle thickness may be formed on a first film with a first film thickness, followed by a plasma treatment. The first particle thickness of the particle may be reduced to a second particle thickness below an allowable limit and the first film thickness of the first film may be reduced to a second film thickness by the plasma treatment. After the plasma treatment, a second film with a third film thickness may be deposited on the first film with a second film thickness and the particle may be buried in the second film with a third film thickness.

The disclosure may have technical advantages of reducing the thickness of particles formed on the film by plasma treatment, and preventing a quality of a substrate processing process and device performances from being deteriorated accordingly.

The disclosure may have additional technical advantages of extending a dry cleaning cycle or a wet cleaning cycle, improving an uptime and operating efficiency of the substrate processing apparatus and a throughput per unit time.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 5 is a flow chart illustrating an embodiment for controlling a size of a particle.

FIG. 6 is a flow chart illustrating another embodiment for controlling a size of a particle.

DETAILED DESCRIPTION OF THE DISCLOSURE

The disclosure is to solve the aforementioned problems of particle generation. More particularly, the disclosure provides a method of controlling a size of the particles formed on a substrate during a substrate processing process without a dry cleaning process or a wet cleaning process. The method may reduce device failure and improve an uptime and an operating efficiency of the substrate processing apparatus.

The disclosure provides a plasma treatment to control a size of the particles formed on a substrate during a substrate processing process, such as film deposition process. More particularly, a sputtering by the plasma treatment may be provided to reduce the size of the particles to below the allowable limit. The term 'allowable limit' here means an upper limit of the size of the particle that does not affect the quality of the substrate processing process. For instance, if the size of particles are below the allowable limit even though particles are formed on the substrate, the quality of film and the device performance are not deteriorated. Therefore, the disclosure provides a method for controlling the size of particles below the allowable limit by the plasma treatment.

Figure 1:
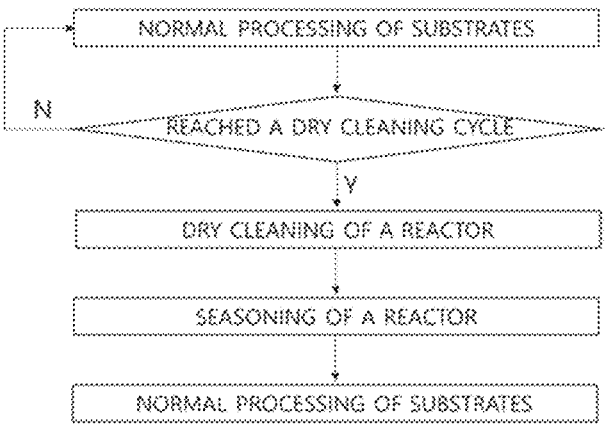
FIG. 1 is a flow chart illustrating a conventional dry cleaning process.
Figure 2:
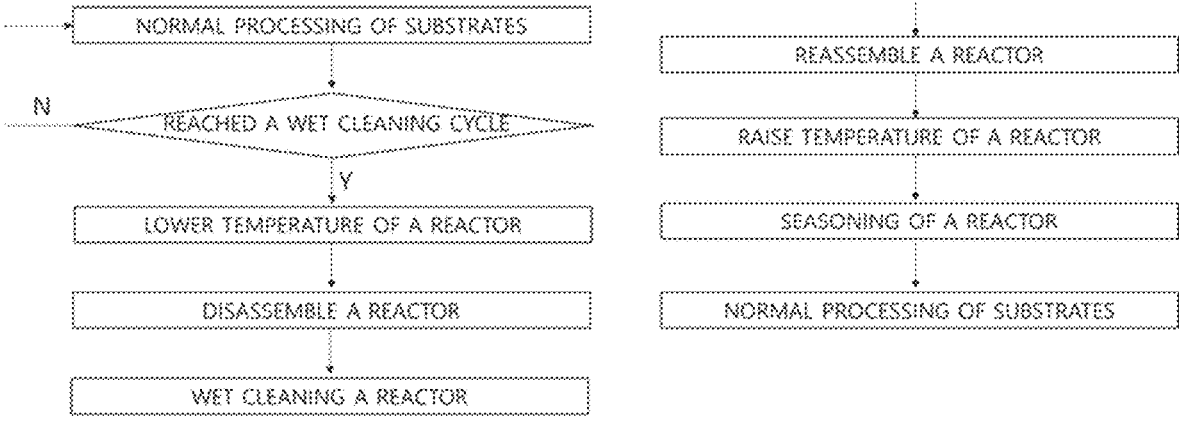
FIG. 2 is a flow chart illustrating a conventional wet cleaning process.
Figure 3:
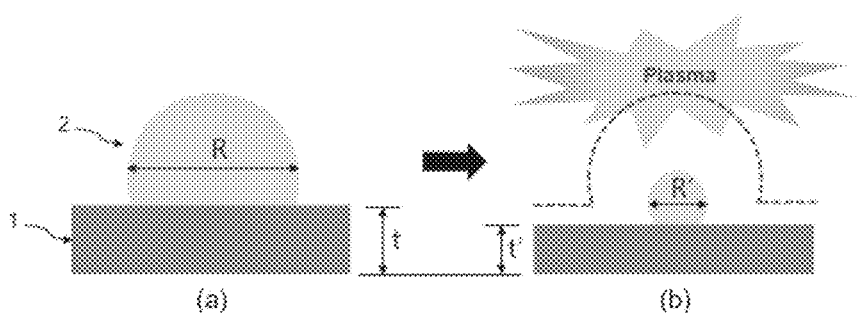
FIG. 3 is a view of an embodiment for controlling a size of a particle.

FIG. 3 illustrates an embodiment to control the size of the particle method.

In FIG. 3(*a*), a film 1 with a first film thickness t may be deposited on a substrate (not shown) and a particle 2 with a first particle thickness R is formed on the film 1. The particle 2 may be generated from a film deposited on an inner surface of a reactor and falls on the substrate, or may be formed by the abnormal growth of the film on the substrate during a chemical reaction between gases. The first particle thickness R of the particle 2 may be above the allowable limit and affect the quality of the substrate processing process and the device performance. For instance, if the particle is above the allowable limit, it may destroy the 3D circuit structure formed on the substrate and increase the device failure.

FIG. 3(*b*) illustrates that the first particle thickness R (dotted line) of the particle 2 may be reduced to the second particle thickness R', which may be below the allowable limit after the plasma treatment. The plasma treatment may be carried out by supplying a gas to the reactor and activating it with RF power supplied to the reactor. The plasma created by the RF power may dissociate the gas and generate active species in the reactor. The activated species may lead to a sputtering effect to the particles 2 by an ion bombardment effect and shrink the particle 2. Therefore, a technical advantage may exist in that it may prevent particles from deteriorating the quality of the substrate processing process. Then the first film thickness t of the film 1 may also be reduced to the second film thickness t' due to the sputtering of the active species.

In FIG. 3(*b*), the second film thickness t' of the film 1 may be a target thickness. Therefore in FIG. 3(*b*), the first film thickness t of the film 1 may be formed thicker than the second film thickness t', that is t>t', considering the reduction of the film thickness by the sputtering in the plasma treatment step.

As shown in FIG. 3, the thickness of the particle may be reduced by the plasma treatment after depositing a film. The reduction of particle size may prevent a process failure.

Figure 4:
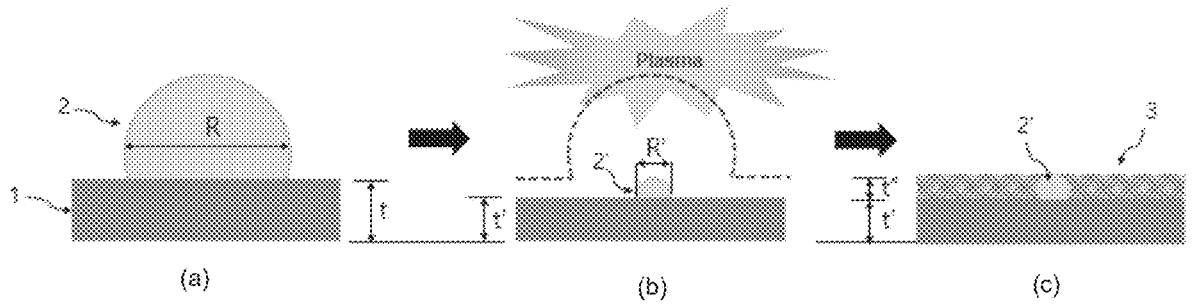
FIG. 4 is a view of another embodiment for controlling a size of a particle.

FIG. 4 illustrates another embodiment of the disclosure.

In FIG. 4(*a*), a first film 1 with a first film thickness t may be deposited on a substrate (not shown) and a particle 2 with a first particle thickness R is formed on the film. In FIG. 4(*b*), the next step after FIG. 4(*a*), a plasma treatment is carried out on the film 1 and the particles 2, and the size of the particle 2' may be reduced to a second particle thickness R' from the first particle thickness R (dotted line). The thickness of the first film 1 may be also reduced to a second film thickness t' due to the sputtering of the active species.

FIG. 4(*c*), the next step after FIG. 4(*b*), illustrates a second film 3 with a third film thickness t'' may be deposited on the first film 1. In FIG. 4(*c*), the second film 3 with the third film thickness t'' may be additionally deposited on the first film 1 and the particle 2' may be buried in the second film 3 with the third film thickness t''. Therefore, this method may have technical advantages of eliminating particles from the film and facilitating formation of semiconductor circuit structures in the subsequent process.

In FIG. 4(*c*), the sum of the second film thickness t' of the first film 1 and the third film thickness t'' of the second film 3 may be the same as the first film thickness t of the first film 1 or be thicker than the first film thickness t of the first film 1, that is, t'+t'' t. In another selective embodiment, the sum of the second film thickness t' of the first film 1 and the third film thickness t'' of the second film 3 may be a target thickness.

As shown in FIG. 4, an additional film, e.g. a second film 3, may be formed after reducing the size of the particle. The benefits of this step are threefold: eliminating the particle from the film; recovering a lost portion of the film; and facilitating the subsequent processing, e.g. forming a 3D circuit structure on it.

FIG. 5 is a flow chart illustrating an embodiment in accordance with FIG. 3. The details of each step of FIG. 5 is as follows.

STEP 1(S1): a film may be deposited on a substrate by supplying a source gas, a reactant, and a purge gas to the substrate. The film may be deposited by at least one of methods of atomic layer deposition (ALD), plasma atomic layer deposition (PEALD), chemical vapor deposition (CVD), plasma chemical vapor deposition (PECVD) and pulsed plasma chemical vapor deposition (Pulsed PECVD). The STEP 1 may be repeated until the film reaches a first film thickness. For instance, in the method of ALD, the deposition process may be carried out by inputting the number of necessary cycles based on the film growth rate per unit cycle in the controller, e.g. PC controller. In the method of CVD, the deposition process may be carried out by inputting the time necessary to deposit the film with the first film thickness based on the film growth rate per unit time in the controller, e.g. PC controller.

In STEP 1(S1), particles with a first particle thickness may be formed on the film during deposition of the film on the substrate. The particles may be generated from film deposited on an inner surface of a reactor and may fall onto the substrate, or may be formed by the abnormal growth of the film on the substrate during a chemical reaction between gases.

STEP 2(S2): A plasma treatment may be carried out on the film with the first film thickness and the particles with the first particles thickness formed on the first film. In STEP 2, a sputtering caused by active species may be carried out on the film and the particles. The plasma may be generated by supplying RF power to the reactor and activating a reactant and a purge gas in order to generate active species. The source gas may not be provided in this step.

In STEP 2(S2), the plasma treatment may result in the reduction of the thickness of the film and the particles. For instance, the first film thickness may be reduced to a second film thickness and the first particle thickness may be reduce to a second particle thickness.

FIG. 6 is a flow chart illustrating another embodiment in accordance with FIG. 4. The details of FIG. 6 are as follows.

STEP 1(S1'): a first film may be deposited on a substrate by supplying a source gas, a reactant, and a purge gas to the substrate. The first film may be deposited by at least one of methods of atomic layer deposition (ALD), plasma atomic layer deposition (PEALD), chemical vapor deposition (CVD), plasma chemical vapor deposition (PECVD) and pulsed plasma chemical vapor deposition (Pulsed PECVD). The STEP 1 may be carried out until the first film reaches a first film thickness. For instance, in the method of ALD, the deposition process may be carried out by inputting the number of necessary cycles based on the film growth rate per unit cycle in the controller, e.g. PC controller. In the method of CVD, the deposition process may be carried out by inputting the time necessary to deposit the film with the first film thickness based on the film growth rate per unit time in the controller, e.g. PC controller.

In STEP 1(S'), particles with a first particle thickness may be formed on the first film during depositing the first film on the substrate. The particles may be generated from a film deposited on an inner surface of a reactor and may fall onto the substrate, or may be formed by the abnormal growth of the first film on the substrate during a chemical reaction between gases.

STEP 2(S2'): A plasma treatment may be carried out on the first film and the particles formed on the first film. In STEP 2, a sputtering caused by active species is carried out on the first film and the particles. The plasma is generated by supplying RF power to the reactor and activates a reactant and a purge gas, except for a source gas, in order to generate active species.

The plasma treatment may result in the reduction of the thicknesses of the film and the particles. For instance, the first film thickness may be reduced to the second film thickness and the first particle thickness may be reduced to the second particle thickness.

STEP 3(S3'): A second film with a third film thickness may be deposited on the first film with the second film thickness. The second film may be deposited by the same method as the STEP 1(S1'). The second film may be identical to the first film or different in another selective embodiment.

The sum of the second film thickness of the first film and the third film thickness of the second film may be the same as the first film thickness of the first film or be thicker than the first film thickness of the first film.

In STEP 3(S3'), the second film with the third film thickness may be additionally deposited on the first film with the second film thickness. As a result, the particles with the second particle thickness may be buried in the second film with the third film thickness. Therefore, it may have technical advantages of eliminating particles from the film and facilitating more to form a semiconductor circuit structures in the subsequent process.

Figure 7:
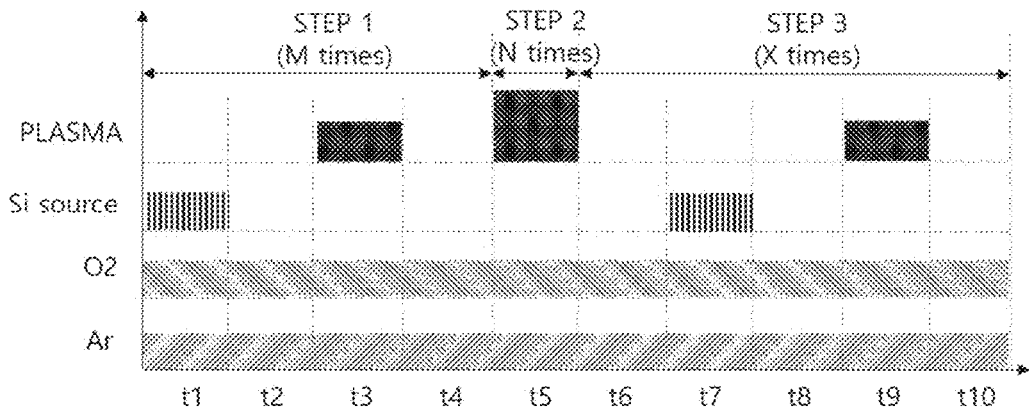
FIG. 7 is a timing diagram of a process of the disclosure.
Figure 9:
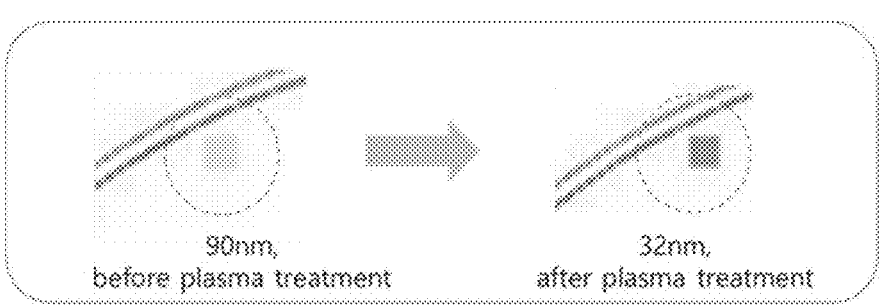
FIG. 9 is a view showing a particle size reduction after a plasma treatment.

FIG. 7 illustrates a timing diagram of a process in accordance with FIG. 3 to FIG. 6. In FIG. 9, $SiO_2$ film may be deposited on the substrate by the method of plasma atomic layer deposition. The details of FIG. 7 are as follows.

In STEP 1, a first $SiO_2$ film may be deposited on the substrate. The STEP 1 may comprise several sub-steps, such as a source supply step t1, a source purge step t2, a plasma supply step t3, and a reactant purge step t4. A Si source gas and a plasma may be supplied alternately, and oxygen gas as reactant and an inert gas as purge gas, e.g. Ar, may be continuously supplied throughout the steps t1 to t4. The plasma may be generated by activating a reactant and Ar gas by a RF power supplied to the reactor. The oxygen gas may act as a reactive purge gas that chemically reacts with Si source gas only when activated by plasma at step t3. In STEP 1, Si source gas and activated oxygen gas may chemically react and deposit a first $SiO_2$ film with a first film thickness. The STEP 1 may be repeated a plurality of times ('M' times) until the first $SiO_2$ film achieves a target film thickness.

In STEP 1, particles with a first particle thickness may be formed on the first $SiO_2$ film with the first film thickness during deposition of the first $SiO_2$ film onto the substrate. The particles may be generated from a $SiO_2$ film deposited on an inner surface of a reactor and may fall onto the substrate, or may be formed by the abnormal growth of the first $SiO_2$ film on the substrate during a chemical reaction between Si source and activated oxygen gas.

In STEP 2, a plasma treatment may be carried out on the first $SiO_2$ film with the first film thickness and the particles with the first particle thickness. The plasma treatment may be carried out by activating oxygen gas and Ar gas by RF power supplied to a reactor. As the Si source gas is not provided, an additional $SiO_2$ film is not deposited in STEP 2. Instead, a sputtering by activated oxygen gas and Ar gas may be carried out on the first $SiO_2$ film and the particles. As a result, the thickness of the first $SiO_2$ film and particles may be reduced. That is, the first film thickness of the first $SiO_2$ film and the first particle thickness of particles may be reduced to the second film thickness of the first $SiO_2$ film and the second particle thickness of particles by the plasma treatment. The STEP 2 may be repeated a plurality times ('N' times).

In another selective embodiment, a high frequency RF power (HRF) and a low frequency RF power (LRF) may be supplied together in order to increase the sputtering effect.

In another selective embodiment, the RF power supplied during the STEP 2 may be greater than the RF power supplied during the STEP 1.

In another selective embodiment, the RF power supplying time t5 in the STEP 2 may be longer than the RF power supplying time t3 in STEP 1.

In STEP 3, a second $SiO_2$ film with a third film thickness may be deposited on the first $SiO_2$ film with the second film thickness. The STEP 3 may comprise several sub-steps, such as a source supply step t7, a source purge step t8, a plasma supply step t9, and a reactant purge step t10. A Si source gas and a RF power may be supplied alternately and oxygen gas as reactant and Ar gas as purge as are continuously supplied throughout the steps t7 to t10. The plasma may be generated by activating a reactant and Ar gas by a RF power supplied to the reactor. The second $SiO_2$ film may be deposited by the same method as the first $SiO_2$ film in STEP 1. The STEP 3 may be repeated a plurality of times until the second $SiO_2$ film achieves the third film thickness ('X' times).

The sum of the second film thickness of the first $SiO_2$ film and the third film thickness of the second $SiO_2$ film may be the same as the first film thickness of the first $SiO_2$ film or be thicker than the first film thickness of the first $SiO_2$ film.

In STEP 3, the second $SiO_2$ film with the third film thickness is additionally deposited on the first $SiO_2$ film. So the particles may be buried in the second $SiO_2$ film with the third film thickness. Therefore, it may have technical advantages of eliminating particles from the film and facilitating formation of semiconductor circuit structures in the subsequent process.

In STEP 1 to STEP 3 of FIG. 7, Ar as purge gas and oxygen as reactant may be continuously supplied. But in another embodiment of the invention, only Ar may be continuously supplied throughout the STEP 1 to STEP 3. That is, oxygen may be supplied during the plasma supply steps t3 and t9. In other words, plasma treatment step may activate only Ar to sputter the film and the particles.

The STEP 1 and the STEP 2 of FIG. 7 may correspond to FIG. 3 and FIG. 5, and the STEP 1, the STEP 2 and the STEP 3 of FIG. 7 may correspond to FIG. 4 and FIG. 6.

Table 1 shows process conditions for STEP 1 for $SiO_2$ film deposition and STEP 2 for plasma treatment of FIG. 7.

TABLE 1

| process conditions of one embodiment of the disclosure | | |
|---|---|---|
| Temperature(° C.) | | 450 to 650° C. (preferably 500 to 600° C.) |
| Process pressure(Torr) | | 1 to 10 Torr (preferably 1.5 to 5 Torr) |
| Si source | | DIPAS(diisoprophylaminosilane) |
| Process gap(mm) | | 5 to 20 mm (preferably 5.5 to 8.0 mm) |
| Gas flow rate(sccm) | O₂ | 1,000 to 4,000 sccm (preferably 2,000 to 3,000 sccm) |
| | Source carrier Ar | 500 to 10,000 sccm (preferably 3,000 to 5,000 sccm) |
| | Purge Ar | 7,000 to 20,000 sccm (preferably 8,000 to 10,000 sccm) |
| Step time for deposition step(sec) | Source feeding | 0.1 to 0.8 second (preferably 0.2 to 0.6 sec) |
| | Source purge | 0.1 to 1.0 second (preferably 0.2 to 0.6 sec) |
| | RF-on | 0.2 to 2.0 second (preferably 0.4 to 1.5 sec) |
| | RF-off and purge | 0.1 to 1.0 second (preferably 0.2 to 0.5 sec) |
| | Cycle | 300 to 500 cycles (preferably 350 to 450 cycles) |
| Step time for plasma treatment step(sec) | RF-on | 0.2 to 4.0 second (preferably 0.8 to 3.0 sec) |
| | Cycle | 50 to 100 cycles (preferably 70 to 90 cycles) |
| Plasma condition | Deposition step (Single Freq.) | RF power | 100 to 2,000 W (preferably 200 to 1,000 W) |
| | | RF frequency | 10 MHz to 100 MHz (preferably 12 to 60 MHz) |
| | Plasma treatment step (Dual Freq.) | RF power | 1,000 to 4,000 W for high freq. (preferably 1,200 to 3,000W) 100 to 1,000 W for low freq.(preferably 300 to 900W) |
| | | RF frequency | 10 MHz to 100 MHz for high freq. (preferably 12 MHz to 60 MHz) 100 KHz to 500 KHz for low freq. (preferably 150 to 450 KHz) |

In Table 1, a single frequency RF power, that is, a high frequency RF power is supplied to the reactor during a deposition step and a dual frequency RF power, that is, a high frequency RF power and a low frequency RF power are supplied during a plasma treatment step.

The process conditions may be adjusted to increase a sputtering effect in plasma treatment step. For instance, in Table 1, a RF power supplying time is longer and a RF power is greater than those in the deposition step. And a dual frequency RF power is supplied rather than a single frequency RF power. The reaction gap is maintained small and the process pressure is maintained low below 10 Torr to increase a sputtering effect as well.

In Table 1, DIPAS (diisoprophylaminosilane; $SiH_3N$ $(iPr)_2$) as a Si source gas and oxygen gas as a reactant may be supplied to deposit a $SiO_2$ film on the semiconductor circuit structure formed on the substrate. But the Si source is not limited thereto. The Si source may comprise at least one of: aminosilane, iodosilane, or silicon halide. For instance, the Si source may comprise at least one of: TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N$ (tBu); DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2$ $(NHtBu)_2$; BITS, $SiH_2(NHSiMe_3)_2$; TEOS, $Si(OEt)_4$; $SiCl_4$; HCD, $Si_2Cl_6$; DCS, $SiH_2Cl_2$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; $Si_3H_8$; $SiHI_3$; or $SiH_2I_2$.

The oxygen gas may comprise at least one of: $O_2$, $O_3$, $CO_2$, $H_2O$, $NO_2$, or $N_2O$; or a combination thereof.

In another embodiment, the first film and the second film may be SiN films and the reactant may be nitrogen-containing gas. For instance, it may comprise at least one of: $N_2$, $NH_3$, $N_2O$, or $NO_2$, or combination thereof.

Figure 8:
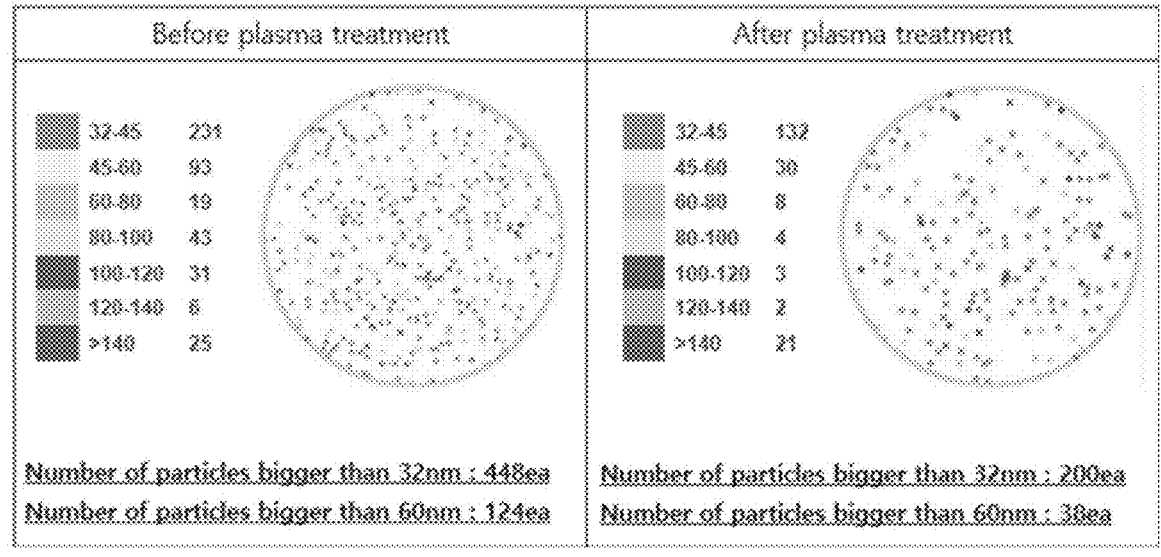
FIG. 8 is a view showing a change of particle size and their numbers before plasma treatment and after plasma treatment.

FIG. 8 is a view illustrating a change of the number and the size of particles formed on $SiO_2$ film during depositing the $SiO_2$ film on the substrate.

As shown in FIG. 8, 124 particles bigger than 60 nm may be formed on the $SiO_2$ film before the plasma treatment, but the number of particles bigger than 60 nm may be reduced to 38 particles after the plasma treatment. That is, the number of big particles bigger than 60 nm may be reduced by 70% due to the sputtering effect during the plasma treatment. The number of small particles ranging from 32 nm to 45 nm may be also reduced by 43% to 132 particles from 231 particles.

FIG. 9 is a view illustrating the reduction of the size of the particle formed on the film by the plasma treatment. The particle in FIG. 9 may be the same particle located on the same position of the same substrate (edge position of the substrate). In FIG. 9, the thickness of the particle may be reduced to 32 nm from 90 nm by the sputtering effect of active species activated by plasma.

According to FIG. 3 to FIG. 9, the disclosure may have technical advantages of reducing the size of particles formed on the film by plasma treatment, and preventing a quality of a substrate processing process and device performances from being deteriorated accordingly.

The disclosure has another technical advantages of extending a dry cleaning cycle or a wet cleaning cycle, improving an uptime and operating efficiency of the substrate processing apparatus and a throughput per unit time.

Figure 10:
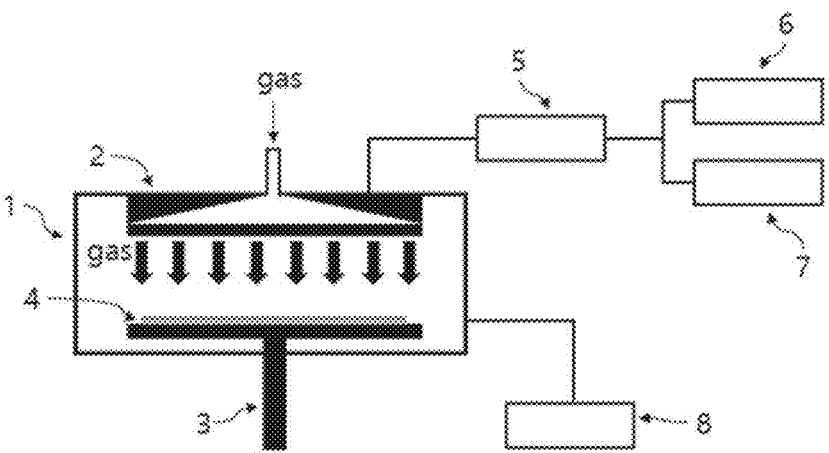
FIG. 10 is a schematic view of a substrate processing apparatus for implementing a process in accordance with the disclosure.

FIG. 10 is a schematic view of a substrate processing apparatus for implementing a process in accordance with the disclosure.

In FIG. 10, a substrate 4 may be disposed on a substrate support 3 and a gas supply unit 2 is provided to the reactor 1, configured to supply a gas to the substrate 4. The substrate support 3 may comprise a heating block supplying a heat energy to the substrate 4. The gas supply unit 2 may be a showerhead. Gas may be supplied to the substrate 4 through the gas supply unit 2 from outside.

The process gas is exhausted through an exhaust unit 8, which may be an exhaust pump. The gas supply unit 2 is connected to the RF power supply unit. The RF power supply unit may comprise: a matching network 5, a high frequency RF power generator 6, or a low frequency RF power generator 7. In an embodiment, the high frequency RF power generator 6 may supply a high frequency RF power to the reactor 1 during a deposition step. In another embodiment, the high frequency RF power generator 6 and the low frequency RF power generator 7 may supply a high frequency RF power and a low frequency RF power to the reactor 1 during a plasma treatment step.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method for processing a substrate comprising:
a deposition step for depositing a first film with a first film thickness on the substrate, the deposition step comprising:
    a source supply step;
    a reactant supply step; and
    a plasma supply step; and
after the deposition step, performing a plasma treatment step for cyclically supplying a plasma to a reactor,
wherein a particle with a first particle thickness is deposited on the first film during the deposition step,
wherein the plasma treatment step comprises sputtering,
wherein an inert gas is continuously supplied throughout the deposition step and the plasma treatment step, and
wherein the first particle thickness is reduced to a second particle thickness, and the first film thickness of the first film is reduced to a second film thickness during the plasma treatment step, wherein the first particle thickness is measured perpendicular to a direction of first film thickness.

2. The method of claim 1, wherein the first particle is generated from a film deposited on an inner surface of a reactor.

3. The method of claim 1, wherein the second particle thickness is below an allowable limit not affecting a quality of the substrate processing process.

4. The method of claim 1, further comprising: depositing a second film with a third film thickness on the first film with the second film thickness.

5. The method of claim 4, wherein a sum of the second film thickness of the first film and the third film thickness of the second film is the same as or bigger than the first film thickness of the first film.

6. The method of claim 5, wherein the particle with the second particle thickness is buried in the second film with the third film thickness, such that the second film covers a top and a side of the particle.

7. The method of claim 4, wherein depositing the second film comprises repeating a plurality of times:
    a source gas supply step;
    a reactant supply step; and
    a plasma supply step.

8. The method of claim 4, wherein the first film and the second film are identical.

9. The method of claim 1, wherein the plasma supply step and the plasma treatment step comprise supplying a RF power to the reactor respectively, and the RF power supplied during the plasma treatment step is greater than the RF power supplied during the plasma supply step.

10. The method of claim 9, wherein the plasma treatment step comprises supplying a high frequency RF power and a low frequency RF power to the reactor.

11. The method of claim 1, wherein the plasma supplied during the plasma treatment step is supplied longer than the plasma supplied during the plasma supply step.

12. The method of claim 1, wherein the source gas comprises at least one of: aminosilane, iodosilane, silicon halide, or combination thereof.

13. The method of claim 12, wherein the source gas comprises at least one of: TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; DCS, $SiH_2Cl_2$; $Si_3H_8$; $SiHI_3$; or $SiH_2I_2$; or combination thereof.

14. The method of claim 1, wherein a reactant provided during the reactant supply step is oxygen-containing gas.

15. The method of claim 1, wherein a reactant provided during the reactant supply step is nitrogen-containing gas.

16. The method of claim 1, wherein a power applied during deposition step is between 200 W and 1000 W per substrate.

17. The method of claim 1, wherein a power applied during the treatments step is between 1000 W and 4000 W per substrate.

18. The method of claim 4, wherein the plasma treatment step is repeated prior to the step of depositing a second film.

* * * * *